(12) United States Patent
Rashed et al.

(10) Patent No.: US 7,542,360 B2
(45) Date of Patent: Jun. 2, 2009

(54) PROGRAMMABLE BIAS FOR A MEMORY ARRAY

(75) Inventors: Mahbub M. Rashed, Austin, TX (US); Robert E. Booth, Austin, TX (US); Sushama Davar, Austin, TX (US); Giri Nallapati, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 143 days.

(21) Appl. No.: 11/780,251

(22) Filed: Jul. 19, 2007

(65) Prior Publication Data

US 2009/0021989 A1    Jan. 22, 2009

(51) Int. Cl.
     *G11C 7/00*      (2006.01)
(52) U.S. Cl. ............. 365/201; 365/185.25; 365/185.18; 365/189.09; 365/225.7
(58) Field of Classification Search ................. 365/201, 365/185.25, 185.18, 189.09, 225.7
See application file for complete search history.

(56) References Cited

U.S. PATENT DOCUMENTS

| 6,888,767 | B1 | 5/2005 | Han |
| 7,080,267 | B2 | 7/2006 | Gary et al. |
| 2005/0091629 | A1 | 4/2005 | Eisenstadt et al. |

FOREIGN PATENT DOCUMENTS

| EP | 1402531 B1 | 8/2006 |
| JP | 01574039 A | 1/1995 |

OTHER PUBLICATIONS

James W. Tschanz, James T. Kao, Siva G. Narendra, Raj Nair, Dimitri A. Antoniadis, Anantha P. Chandrakasan, and Vivek De, "Adaptive Body Bias for Reducing Impacts of Die-to-Die and Within-Die Parameter Variations on Microprocessor Frequency and Leakage" IEEE Journal of Solid-State Circuits, vol. 37, No. 11, Nov. 2002, pp. 1396-1402.

Lawrence T. Clark, Michael Morrow, and William Brown, "Reverse-Body Bias and Supply Collapse for Low Effective Standby Power" IEEE Transactions on Very Large Scale Integration Systems, vol. 12, No. 9, Sep. 2004, pp. 947-956.

*Primary Examiner*—Tuan T. Nguyen
(74) *Attorney, Agent, or Firm*—Daniel D. Hill; James L. Clingan, Jr.

(57) ABSTRACT

A method determines a body bias for a memory cell. A supply voltage is applied to the memory cell and a bit line is precharged to a voltage lower than the supply voltage. A programmable bias voltage circuit provides a bias voltage to the memory cell in response to values on its input. Initial test values for the input are used. The memory cell is tested to determine a pass or a fail condition of the memory cell. The initial values are retained as the input values if the memory cell passes. If the memory cell fails, the memory cell is tested at changed values for the input. If the changed input values result in the memory cell being in a pass condition, the programmable bias voltage circuit is configured, in non-volatile fashion, to have the changed input values.

20 Claims, 3 Drawing Sheets

PROGRAMMABLE BIAS FOR A MEMORY ARRAY

BACKGROUND

1. Field

This disclosure relates generally to memories, and more specifically, to programmable bias for a memory array.

2. Related Art

Traditional dual supply memories include a voltage supply for the memory array and another voltage supply for the peripheral circuits, including row decoders and column multiplexers. Typically, in low power applications to reduce power consumption, the peripheral voltage supply is maintained at a lower voltage level than the memory array voltage. As the peripheral voltage supply is lowered, however, the memory cells in the memory array can develop various problems. For example, a lowered peripheral voltage supply, which is used to precharge the memory cells, can result in read disturb problem. In particular, when the precharge voltage is lower than the array voltage then the read disturb problem becomes worse. Specifically, as the precharge voltage is lowered compared with the array voltage a voltage differential develops between the bitline and the stored value in the bitcell. Read disturb relates to a situation when the stored value in the bitcell may change because of the additional current path from high storage node to the bitline because of the lower periphery voltage than the array voltage.

Accordingly, there is a need for programmable bias for a memory array that may be used to eliminate read disturb or at least lower the chances of read disturb.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
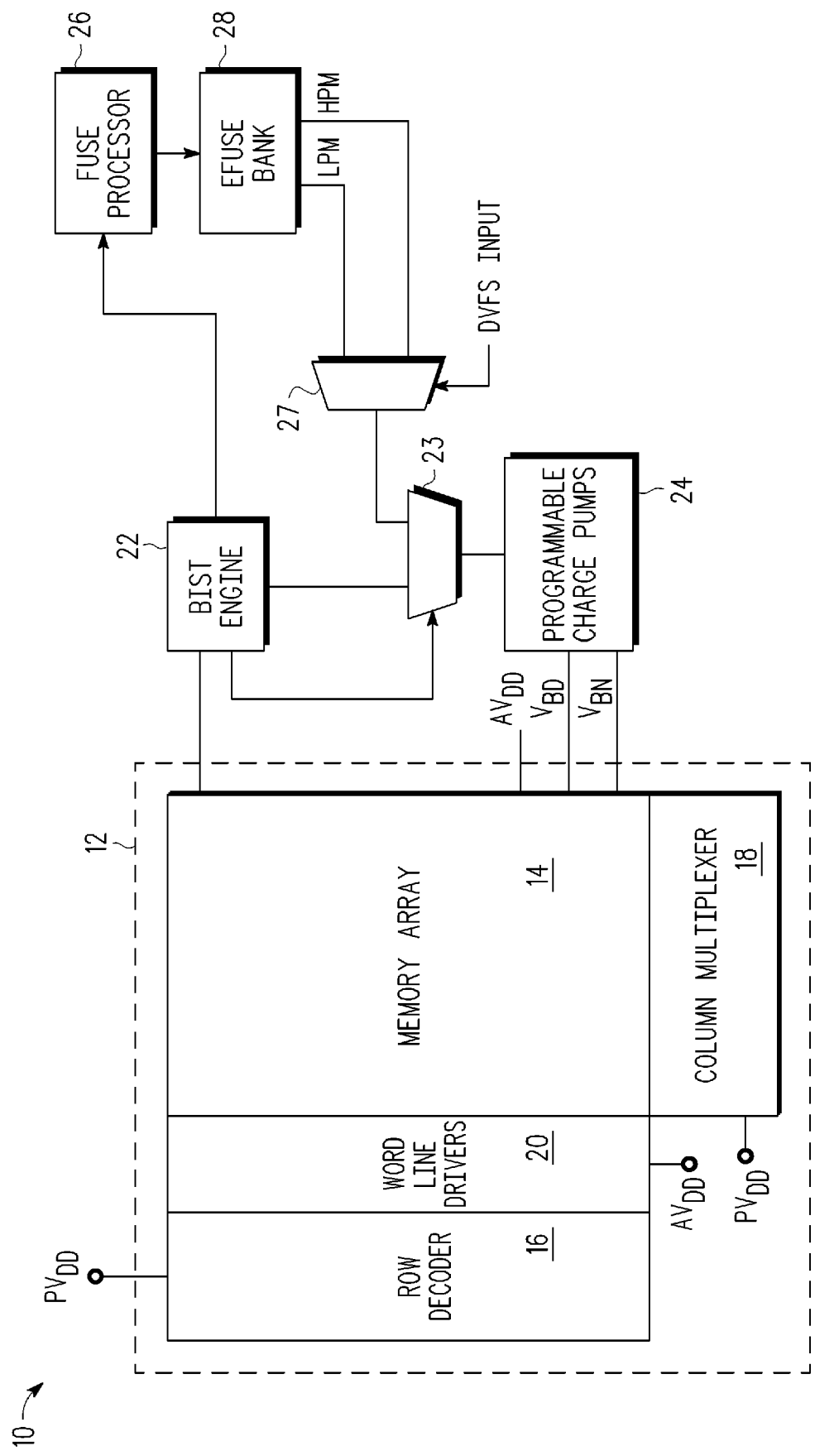
FIG. 1 shows an exemplary system with a programmable bias for a memory array.

Programmable bias for a memory array is provided such that bias voltages applied to various transistors of a memory cell can be changed, as needed. By way of example, a dual voltage supply memory system is described. The dual voltage supply memory system may include an array voltage for the memory array and a periphery voltage for the peripheral circuitry, including for example, the read decoder and the column multiplexer. In one example, the pass gate transistors of a 6T SRAM cell may be biased in a manner that the threshold voltage of the pass gate transistors is increased. Similarly, the PMOS pull-up transistors of the 6T SRAM cell may be biased to ensure good write margin or to improve read disturb.

In one aspect, a method for determining a body bias for a memory cell coupled to a bit line is provided. The method includes applying a first supply voltage to the memory cell and precharging the bit line to a voltage lower than the first supply voltage as a first test condition representative of a first mode of operation of the memory cell. The method further includes providing a programmable bias voltage circuit that provides a bias voltage to the memory cell based on input values. The method further includes applying initial test values cell in the first test condition using the initial test values to determine a pass or a fail condition of the memory cell and retaining the initial values as the input values if the memory cell has a pass condition. The method further includes, if the memory cell has a fail condition, testing the memory cell with the memory cell in the first test condition at changed input values that are changed from the initial values, and if the changed input values result in the memory cell being in a pass condition, configuring, in non-volatile fashion, the programmable bias voltage circuit to have the changed input values.

In another aspect, method of providing a body bias to memory cells of a memory array having word lines and bit lines, is provided. The method includes providing a first programmable voltage circuit having an output for providing the body bias responsive to a first digital input signal. The method further includes applying a first voltage as a power supply voltage to the memory array. The method further includes precharging the bit lines to a second voltage more than fifteen percent lower than the first voltage. The method further includes providing the first digital input signal at first initial values. The method further includes testing the memory array. The method further includes if the memory array passes the testing, retaining the first initial values. The method further includes, if the memory array fails the testing, changing the values of the first digital signal to values selected among a group of available values and re-testing the memory array until one of a group consisting of two events occurs, wherein a first event of the two events comprises the first digital signal has been changed to all of the values of the group of available values and a second event of the two events comprises the memory array passes the test using one of the available values. The method further includes programming, in non-volatile fashion, the one of the available values for use as the first digital input signal of the first programmable voltage circuit.

In yet another aspect, a system including a memory array comprising memory cells, word lines, bit lines, a power supply input, and a first body bias input, is provided. The system further includes bit line precharge means for precharging the bit lines to a voltage below a power supply voltage applied at the power supply input. The system further includes a built in self test (BIST) engine coupled to the memory array and the storage unit. The system further includes a storage unit providing a first digital output. The system further includes a programmable charge pump (or a programmable regulator) having a supply output coupled to the first body bias input and a programming input coupled to the first digital output.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal or node described herein may be designed as positive or negative logic, where negative logic can be indicated by a B following the signal name or the node name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 shows an exemplary system 10 with a programmable bias for a memory array. System 10 may correspond to a memory system located on an integrated circuit. System 10 may include a memory 12. Memory 12 may further include a memory array 14, a row decoder 16, a column multiplexer 18, and wordline drivers 20. Memory 12 may include additional components. Memory array 14 may receive an array voltage via the $AV_{DD}$ voltage terminal. Wordline drivers 20 may also receive the array voltage via the $AV_{DD}$ voltage terminal. Peripheral circuitry, including row decoder 16 and column multiplexer 18 may receive periphery voltage via the $PV_{DD}$ periphery voltage terminal. By way of example, the array voltage may be 1.2 volts, while the periphery voltage may be 0.8 volts. In one embodiment, the periphery voltage is the same as the voltage received by logic components located on the same integrated circuit as memory 12.

System 10 may further include a built-in self test (BIST) engine 22, a multiplexer 23, programmable charge pumps 24, a fuse processor 26, a multiplexer 27, and an Efuse bank 28. BIST engine 22 is coupled to memory 12 and may be used to test memory 12. BIST engine 22 may include various registers, including a register used to store a default value that may be used as an input for programmable charge pumps 24. In one embodiment, programmable regulators may be used instead of programmable charge pumps 24. Programmable charge pumps 24 may provide voltages $V_{BP}$ and $V_{BN}$. Voltage $V_{BP}$ may be used to bias the bodies of PMOS transistors of memory cells forming memory array 14. Voltage $V_{BN}$ may be used to bias the bodies of NMOS transistors of memory cells forming memory array 14. In particular, PMOS transistors may be formed in N wells and the voltage $V_{BP}$ may be applied directly to the N wells. Similarly, NMOS transistors may be formed in P wells and the voltage $V_{BN}$ may be applied directly to the P wells. Programmable charge pumps 24 may provide different amounts of $V_{BP}$ and $V_{BN}$ voltages based on an input received via multiplexer 23. By way of example, multiplexer 23 may receive two inputs, one from BIST engine 22 and the other from Efuse bank 28 via multiplexer 27. BIST engine 22 may provide an initial default value. In one embodiment, the default value may be a four bit value, where the first two bits of the default value may be used to control a level of the voltage $V_{BP}$ and the next two bits of the default value may be used to control a level of the voltage $V_{BN}$. Multiplexer 23 may output either the value being received from BIST engine 22 or the value being received from multiplexer 27 based on a control input received from BIST engine 22. In particular, when the control input received from BIST engine 22 is asserted, multiplexer 23 may output the value being received from BIST engine 22. On the other hand, when the control input from BIST engine 22 is negated, multiplexer 23 may output the value being received from multiplexer 27. In response to a dynamic voltage frequency scaling (DVFS) input, Efuse bank 28 may output a low performance mode (LPM) value or a high performance mode (HPM) value. Efuse bank 28 may include various fuses, which may be blown or configured otherwise, such that the Efuse bank outputs the desired values to be input to multiplexer 27. The LPM value and the HPM value may be provided as input to multiplexer 27. Multiplexer 27 may receive a dynamic voltage frequency scaling (DVFS) input from a DVFS system, for example. The DVFS input may control the output of multiplexer 27. Based on the DVFS input value (0 or 1), either the LPM value or the HPM value may be passed onto multiplexer 23. This way, in a high performance mode, programmable charge pumps 24 may output a different bias voltage than in the low performance mode.

Figure 2:
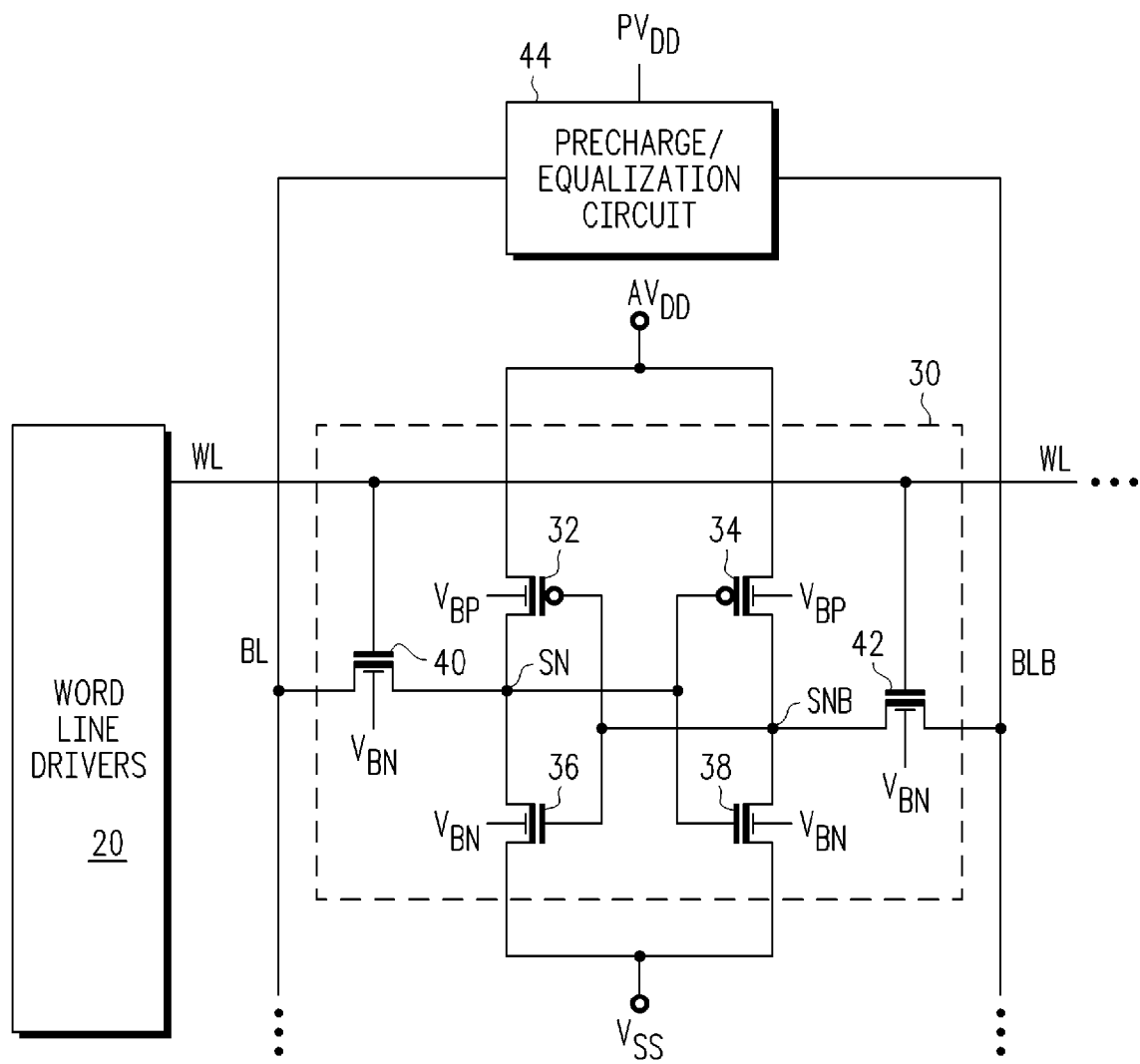
FIG. 2 shows an exemplary memory cell corresponding to the memory array of FIG. 1.

FIG. 2 shows an exemplary memory cell 30 corresponding to the memory array of FIG. 1. Memory cell 30 may be a static random access memory (SRAM) memory cell. Memory cell 30 may include pull up PMOS transistors 32, 34, pull down NMOS transistors 36, 38, and pass gate NMOS transistors 40, 42. PMOS transistors 32 and 34 may have their N wells coupled to the voltage $V_{BP}$. NMOS transistors 36, 38, 40, and 42 may have their P wells coupled to the voltage $V_{BN}$. Memory cell 30 may be coupled to the array voltage $AV_{DD}$. Wordline driver 20 may be coupled to wordlines WL. Each word line may be coupled to respective pass gate transistors, consistent with conventional 6T SRAM cell architecture. Bitlines BL/BLB may be used to precharge memory cell 30 using precharge/equalization circuit 44. Precharge/equalization circuit 44 may receive peripheral voltage $PV_{DD}$. Although FIG. 2 shows a 6T SRAM cell, other SRAM cell architectures, such as 8T SRAM cells or 10T SRAM cells may also be used consistent with other embodiments of the invention. Also, although FIG. 2 illustrates a single port memory cell, dual port memory cells may also be used consistent with other embodiments of the invention. In particular, a dual port memory cell may have two pass gate NMOS transistors coupled to each of bitlines BL and BLB, respectively. Each of the NMOS transistors may receive the $V_{BN}$ voltage.

In terms of the operation of memory cell 30, as explained above voltages $V_{BN}$ and $V_{BP}$ are programmable. These voltages may be adjusted to prevent read disturb or at least to lower the probability of read disturb. By way of example, the threshold voltage (Vt) of pass gate NMOS transistors 40 and 42 may be raised by 100 to 150 mV, such that $PV_{DD}$ can be lowered by a similar amount without having read disturb issues. The increased Vt of pass gate NMOS transistors 40 and 42 would lower the chance of the value stored at node SN from changing state while being read. By adjusting the $V_{BP}$ voltage below $AV_{DD}$ read disturb may be improved, because of the decrease in the threshold voltage (Vt) of the PMOS transistors. Moreover, by adjusting the $V_{BP}$ voltage above $AV_{DD}$, the write margin of memory bitcell 30 may be improved. In particular, by increasing the $V_{BP}$ voltage above $AV_{DD}$, the threshold voltage (Vt) of the PMOS transistors would increase, which in turn would improve their write margin. Additionally, in a high performance mode, the speed or write margin of the memory bitcell can also be improved by decreasing the threshold voltage of the NMOS transistors by adjusting the $V_{BN}$ voltage. The adjustment of the various bias voltages may result in application voltage dependent memory optimization providing higher yield and lower power.

Figure 3:
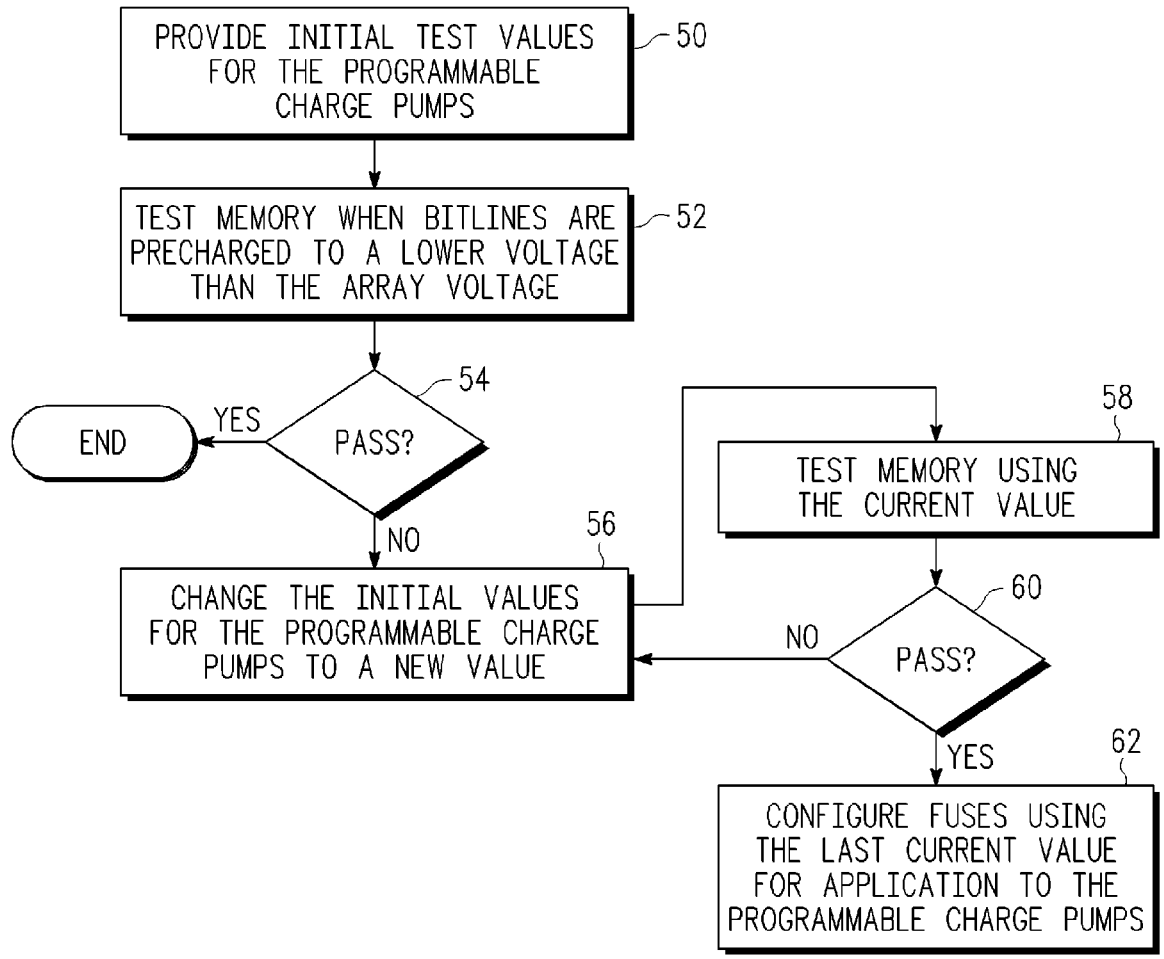
FIG. 3 shows a flow chart for an exemplary method for generating programmable bias for the memory array of FIG. 1.

FIG. 3 shows a flow chart for an exemplary method for generating programmable bias for the memory array of FIG. 1. In one embodiment, the programmable body bias for memory cell 30 may be determined using the method shown in FIG. 3. The method may include providing initial test values for programmable charge pumps 24 (step 50). In one embodiment, BIST engine 22 may provide initial test values via multiplexer 23 to programmable charge pumps. Programmable charge pumps 24 may in response to the initial test values generate bias voltages $V_{BP}$ and $V_{BN}$, which may be applied to the wells of PMOS transistors and NMOS transistors of memory bitcell 30, as described above with respect to FIG. 2. Next, the memory cell may be tested when bitlines are precharged to a voltage lower than the memory array voltage (step 52). In this manner, the memory bitcell may be tested in a first test condition to determine a pass or a fail condition of the memory bitcell (step 54). If the memory bitcell passes the test, then the process may end at this stage. If necessary, the initial test values may be retained. The retained initial test values may further be used to configure the fuses in Efuse bank 28, if necessary. If the memory bitcell fails the test, however, the initial values for programmable charge pumps 24 may be changed to a new value (step 56). Next, the memory bitcell, for example, memory bitcell 30, may be tested using the current value (step 58). If the memory bitcell fails the test (step 60), then the value for controlling the output voltage of programmable charge pumps 24 may be further changed. On the other hand, if the memory bitcell passes the test, then the fuses in Efuse bank 28 may be blown or configured such that programmable charge pumps 24 always generates bias voltages in accordance with the input values that result in correct operation of the memory bitcell. One skilled in the art will appreciate that by correcting the operation of the memory bitcell in this manner, any redundancy built into a memory may be avoided. Thereby resulting in savings of space. Although FIG. 3 describes a particular sequence of steps, these steps need not be performed in the order described.

Those skilled in the art will further recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for determining a body bias for a memory cell coupled to a bit line, comprising:

applying a first supply voltage to the memory cell and precharging the bit line to a voltage lower than the first supply voltage as a first test condition representative of a first mode of operation of the memory cell;

providing a programmable bias voltage circuit that provides a bias voltage to the memory cell based on input values;

applying initial test values as the input values;

testing the memory cell with the memory cell in the first test condition using the initial test values to determine a pass or a fail condition of the memory cell and retaining the initial values as the input values if the memory cell has a pass condition; and if the memory cell has a fail condition, testing the memory cell with the memory cell in the first test condition at changed input values that are changed from the initial values, and if the changed input values result in the memory cell being in a pass condition, configuring, in non-volatile fashion, the programmable bias voltage circuit to have the changed input values.

2. The method of claim 1, wherein the configuring is further characterized by programming electrical fuses.

3. The method of claim 1, further comprising:

applying the first supply voltage to the memory cell and precharging the bit line to the first supply voltage as a second test condition, wherein second test condition is representative of a second mode of operation of the memory cell;

applying second initial test values as the input values;

testing the memory cell with the memory cell in the second test condition using the second initial test values to determine a pass or a fail condition of the memory cell and retaining the second initial values as the input values for the second mode of operation if the memory cell has a pass condition; and if the memory cell has a fail condition, testing the memory cell with the memory cell in the second test condition at second changed input values that are changed from the second initial values, and if the second changed input values result in the memory cell being in a pass condition, configuring, in non-volatile fashion, the programmable bias voltage circuit to have the second changed input values for use in the second mode of operation.

4. The method of claim 3, wherein the second mode of operation is a higher speed mode of operation than the first mode.

5. The method of claim 1, wherein the memory cell is a static random access memory cell having a plurality of N channel transistors in a P well, wherein the step of providing the programmable bias voltage circuit is further characterized by having an output directly connected to the P well.

6. The method of claim 1 wherein the memory cell is a static random access memory cell having a plurality of P channel transistors in an N well, wherein the step of providing the programmable bias voltage circuit is further characterized by having an output directly connected to the N well.

7. The method of claim 6, wherein the static random access memory cell has a plurality of N channel transistors in a P well, further comprising:

providing a second programmable bias voltage circuit that provides a bias voltage to the P well;

applying second initial test values as the input values of the second programmable bias voltage circuit;

wherein the testing the memory cell with the memory cell in the first test condition is further characterized as using the second initial test values and retaining the second initial values as the input values of the second programmable bias voltage circuit if the memory cell has a pass condition; and wherein if the memory cell has the fail condition, testing the memory cell with the memory cell in the first test condition at second changed input values that are changed from the second initial values, and if the second changed input values result in the memory cell being in a pass condition, configuring, in non-volatile fashion, the second programmable bias voltage circuit to have the second changed input values.

8. The method of claim 1, wherein the step of applying a first supply voltage to the memory cell and precharging the bit line to a voltage lower than the first supply voltage as a first test condition representative of a first mode of operation of the memory cell further comprises applying the first supply voltage to a word line coupled to the memory cell.

9. The method of claim 1, wherein the step of applying a first supply voltage to the memory cell and precharging the bit line to a voltage lower than the first supply voltage as a first test condition representative of a first mode of operation of the memory cell is further characterized by the voltage lower than the first supply voltage is more than fifteen percent below the first power supply voltage.

10. A method of providing a body bias to memory cells of a memory array having word lines and bit lines, comprising
providing a first programmable voltage circuit having an output for providing the body bias responsive to a first digital input signal;
applying a first voltage as a power supply voltage to the memory array;
precharging the bit lines to a second voltage more than fifteen percent lower than the first voltage;
providing the first digital input signal at first initial values;
testing the memory array;
if the memory array passes the testing, retaining the first initial values;
if the memory array fails the testing, changing the values of the first digital signal to values selected among a group of available values and re-testing the memory array until one of a group consisting of two events occurs, wherein a first event of the two events comprises the first digital signal has been changed to all of the values of the group of available values and a second event of the two events comprises the memory array passes the test using one of the available values; and
programming, in non-volatile fashion, the one of the available values for use as the first digital input signal of the first programmable voltage circuit.

11. The method of claim 10, wherein the step of programming comprises programming electrical fuses.

12. The method of claim 10, further comprising
providing a second programmable voltage circuit having an output for providing a second body bias responsive to a second digital input signal;
providing the second digital input signal at second initial values;
wherein if the memory array passes the testing, retaining the second initial values;
wherein if the memory array fails the testing, changing the values of the second digital signal to values selected among a second group of available values and re-testing the memory array until one of a group consisting of a third event and a fourth event, wherein the third event comprises the second digital signal has been changed to all of the values of the second group of available values and a fourth event comprises the memory array passes the test using one of the values of the second group of available values; and
programming, in non-volatile fashion, the second digital signal to the one of the values of the second group of available values.

13. The method of claim 10, wherein:
the step of precharging the bit lines is further characterized as, for a second mode of operation, precharging the bit lines to the first voltage;
the providing the first digital input signal is further characterized as being provided at second initial values;
if the memory array passes the testing, retaining the second initial values;
if the memory array fails the testing, changing the values of the first digital signal to values selected among a second group of available values and re-testing the memory array until one of a group consisting of a third and a fourth event occurs, wherein a third event comprises the first digital signal has been changed to all of the values of the second group of available values and a fourth event of the two events comprises the memory array passes the test using one of the second group of available values; and
programming, in non-volatile fashion, the one of the second group of available values for use as the first digital input signal of the first programmable voltage circuit.

14. The method of claim 13, further comprising switching between the one of the first group of available values and the one of the second group of available values for use as the first digital input signal of the first programmable voltage circuit.

15. A system comprising:
a memory array comprising memory cells, word lines, bit lines, a power supply input, and a first body bias input,
bit line precharge means for precharging the bit lines to a voltage below a power supply voltage applied at the power supply input;
a built in self test (BIST) engine coupled to the memory array and the storage unit;
a storage unit providing a first digital output; and
a programmable charge pump or a programmable regulator having a supply output coupled to the first body bias input and a programming input coupled to the first digital output.

16. The system of claim 15, wherein the storage unit is non-volatile.

17. The system of claim 16, wherein the storage unit is an electrical fuse bank, further comprising a fuse processor coupling the BIST engine to the electrical fuse bank.

18. The system of claim 15, wherein:
the bit line precharge means is for precharging the bit lines to a voltage at least 15 percent below the power supply voltage in a first mode and for precharging the bit lines to the power supply voltage in a second mode; and
the storage unit is for providing a second digital output for use in the second mode;
further comprising:
a multiplexer coupled between the input of the programmable charge pump or the programmable regulator and the storage unit for selecting between the first and second digital signals.

19. The system of claim 15, wherein the first body bias input is directly connected to bodies of N channel transistors of the memory cells.

20. The system of claim 19, wherein the storage unit is for providing a second digital output, further comprising:

a second body bias input directly connected to bodies of P channel transistors of the memory cells; and a second programmable charge pump or a second programmable regulator having a supply output coupled to the second body bias input and a programming input coupled to the second digital output.

* * * * *